United States Patent [19]

Toyomaki

[11] 4,107,622

[45] Aug. 15, 1978

[54] TONE CONTROLLER

[75] Inventor: Kazuya Toyomaki, Yokohama, Japan

[73] Assignee: Victor Company of Japan, Limited, Japan

[21] Appl. No.: 736,393

[22] Filed: Oct. 28, 1976

[30] Foreign Application Priority Data

Oct. 29, 1975 [JP] Japan .................................. 50-129355

[51] Int. Cl.² ............................................. H03F 3/04
[52] U.S. Cl. .................................. 330/302; 179/1 D; 330/103; 330/108; 330/109; 330/294
[58] Field of Search ...................... 179/1 D, 100.1 TC; 330/103, 108, 109, 294, 302; 333/28 T

[56] References Cited

U.S. PATENT DOCUMENTS

| | | | |
|---|---|---|---|
| 3,643,173 | 2/1972 | Whitten | 330/31 X |
| 3,683,293 | 8/1972 | Matsui | 330/31 |
| 3,914,716 | 10/1975 | Kurata | 179/1 D X |

*Primary Examiner*—Lawrence J. Dahl
*Attorney, Agent, or Firm*—Lowe, King, Price & Markva

[57] ABSTRACT

A feedback resistor is interposed between a reversing input terminal of an audio amplifier and at least one impedance circuit. The impedance circuit is connected to an output terminal of the amplifier to receive an amplified audio signal from the amplifier. The signal controlled in its frequency characteristic in the impedance circuit. A fraction of the signal is negatively fed back to the amplifier through a feedback resistor.

15 Claims, 20 Drawing Figures

TONE CONTROLLER

The present invention relates generally to a tone controller with a simple circuit arrangement, particularly to a tone controller having an easily flattened frequency response, an easily controlled gain, and more particularly to a tone controller which effectively reduces electrical noise generated in a reactance thereof.

It is well known in the audio-frequency amplifier art to use a tone controller to secure the most pleasing base to treble proportion. However, several defects exist in the conventional tone controller, as described infra. In this specification, reference characters with the prefixes R, L and C, respectively, denote a resistance, an inductance, or a capacitance of an electrical component which is designated by reference character with no suffix. In each audio amplifier 2 illustrated either in the prior art (per FIGS. 1 and 2) or in accordance with the embodiments of the invention, noninverting and inverting input terminals 2a and 2b are provided and an amplified signal, indicative of the difference between the signals at terminals 2a and 2b, is derived at output terminal 2c. In the prior art circuit of FIG. 1, the signal at terminal 2c is fed to two impedance circuits 20 and 22, and a fraction of the voltage of the amplified signal is negatively fed back from circuits 20 and 22 to reversing input terminal 2b. Impedance circuits 20 and 22, respectively, control the gain of lower and higher frequency bands of an audio signal supplied to terminal 1 and noninverting input terminal 2a. Output terminal 2c of the amplifier 2 is connected to a resistor R1 of the impedance circuit 20. The resistor R1 forms a series resistance circuit together with a resistor R2 and a potentiometer P1. The potentiometer P1 is provided with a slidable contact 24 which divides the resistance of the potentiometer P1 into two portions, one being designated by reference character R5 and the other by R6. A capacitor C1 is connected, through the slidable contact 24, across the portion R5 of the potentiometer P1, and another capacitor C2 is connected, through the slidable contact 24, across the other portion R6. Whereas, the output terminal 2c is connected to a capacitor C3 of the impedance circuit 22. The capacitor C3 forms a series circuit together with resistors R3, R4, a potentiometer P2, and another capacitor C4. The potentiometer P2 is provided with a slidable contact 26 which is connected to the slidable contact 24 through a resistor R9. The slidable contact 26 divides the resistance of the potentiometer P2 into two portions, one being designated by reference character R7 and the other by R8. A junction 28 between the resistor R9 and the potentiometer P2 is connected to the inverting input terminal 2b in order to negatively feed back fraction of the output voltage of the amplifier 2. Thus, the desired frequency response can be obtained by adjusting the two potentiometers P1 and P2. In a tone controller, it is practical to design the circuit so as to get a flat frequency response when the slidable contacts 24 and 26 are respectively positioned in the center of the potentiometers P1 and P2. In order to attain the flat frequency response, it is necessary to establish the following conditions:

$$\frac{R'1}{R'2} = \frac{R'3}{R'4} = \frac{C'2}{C'1} = \frac{C'4}{C'3} = \frac{R'5}{R'6} = \frac{R'7}{R'8} \quad (1)$$

where each primed component indicates the value of the particular component.

However, in the circuit of FIG. 1, it is considerably difficult in practice to provide such electrical components to satisfy the Equation (1). Furthermore, even if such electrical components are provided, it is impossible to change the gain of the circuit of FIG. 1 and attain a flat frequency response, because the gain of the circuit is determined by the fixed resistances R'1 and R'2 as follows:

$$\text{GAIN} = 1 + \frac{R'1}{R'2} \quad (2)$$

Reference is now made to FIG. 2, which shows a circuit configuration of another conventional tone controller. The non-reversing terminal 2a of the amplifier 2 is connected to the input terminal 1 to be responsive to an electrical, audio signal. The audio signal thus received is then amplified in the amplifier 2 to a predetermined level. The amplified signal is fed, through the output terminal 2c of the amplifier 2 and also through a terminal 4 of an impedance circuit unit consisting of impedance circuits X2 and Y2, to a junction 28 between resistors Rb and Rc. The resistor Rc is connected through a terminal 5 to the reversing terminal 2b that is connected to ground through resistor R17. On the other hand, the resistor Rb is connected via a terminal 6 to the output terminal 3 to which one end of resistor R11 is connected; the other end of resistor R11 is grounded. A resistor R12, which indicates an input impedance of the following stage (not shown), is connected to the output terminal 3. A potentiometer P3, connected between the terminals 5 and 6, includes a grounded center tap 32 and a center tap 33 that is connected to ground via a series resonance circuit, consisting of a capacitor C5, an inductor L1, and a resistor R13.

Tone control with the circuit of FIG. 2 is performed by adjusting the slidable contact 33. In practice, a plurality of impedance circuits, each resembling the circuit Y2 are connected between the terminals 5 and 6 for more precise tone control.

In FIG. 3, there is shown a frequency response of the circuit of FIG. 2 in the case where further four impedance circuits, each resembling the circuit Y2, are added in parallel between the terminals 5 and 6 in FIG. 2.

The prior art of FIG. 2, however, has some drawbacks, one being that considerable noise is generated and amplified when contact 33 is slid towards the terminal 5. This noise is objectionable to practical use and should be removed.

It is therefore an object of the present invention to provide an improved tone controller which removes the above described defects inherent in the prior art.

Additional objects as well as features and advantages of the invention will become evident from the detailed description set forth hereinafter when considered in conjunction with the accompanying drawings, wherein like parts in each of the several figures are identified by the same reference characters, and wherein.

Figure 1:
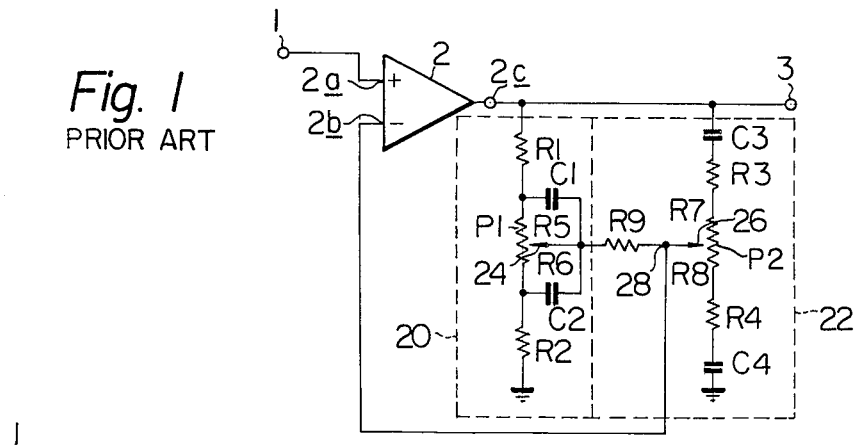
FIG. 1 is a circuit configuration illustrating a conventional tone controller.
Figure 2:
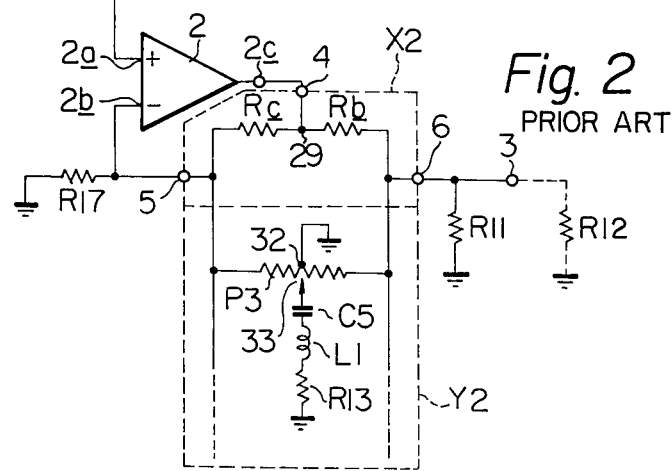
FIG. 2 is a circuit configuration illustrating another conventional tone controller.
Figure 3:
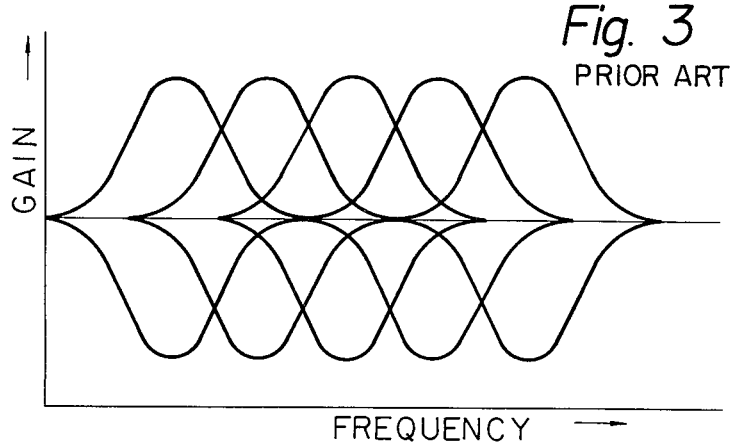
FIG. 3 is a graph showing a frequency response of a tone controller modified based on FIG. 2.
Figure 4:
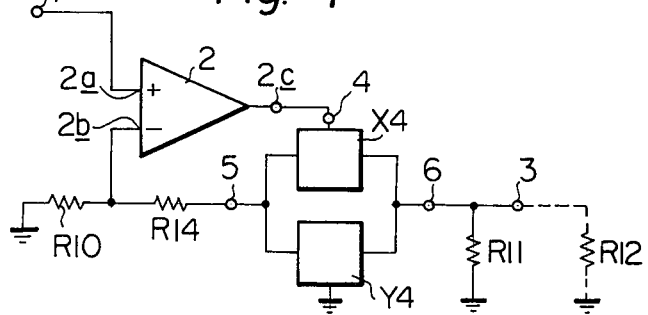
FIG. 4 is a tone controller embodying the present invention, partly in block diagram.

Reference is made to FIG. 4, wherein there is illustrated partly in block form, a circuit configuration of the present invention. An important difference between the circuits of FIGS. 2 and 4 is that the latter is provided with a feedback resistor R14 between the reversing input terminal 2b and the terminal 5. Owing to the resistor R14, the noise generation inherent in the prior art is effectively suppressed as will be described in detail later. The amplified signal from the amplifier 2 is fed to the impedance circuit unit (no numeral) which consists of impedance circuits X4 and Y4, and which is provided with the three terminals 4, 5, and 6. The amplified signal is controlled in the impedance circuit unit in its frequency characteristic to be fed to the next stage (not shown) through the terminal 3 and a fraction of the output voltage from amplifier 2 is negatively fed back to the reversing input terminal 2b.

Usually it is necessary to provide a tone controller with a flat frequency response when a slidable contact of a potentiometer is positioned at the center point of the potentiometer. This requirement, according to the circuit of FIG. 4, is readily carried out, if the resistances of the resistors R10, R11, R12, and R14 are selected to satisfy the following equation $$R'10 + R'14 = \frac{R'11 \cdot R'12}{R'11 + R'12} \quad (3)$$

and if impedance of the one side of the circuits X4 and Y4, with respect to the potentiometer center point, the terminal 4, and ground, equals the impedance of the other side of the cicuits X4 and Y4. If the above conditions are fulfilled, the circuit configurations of the circuits X4 and Y4 are not concerned.

Furthermore, the gain of the tone controller of FIG. 4 is $$1 + \frac{R'14}{R'10} \quad (4)$$

so that one can obtain a desired value by changing the ratio of the resistances of the resistors R10 and R14.

Figure 5:
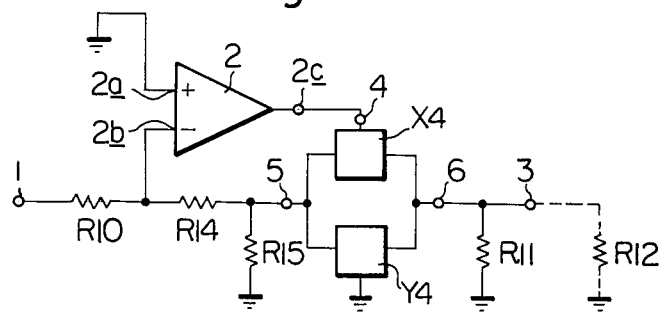
FIG. 5 is a modification of the tone controller of FIG. 4.

Reference is now made to FIG. 5, which is a modification of FIG. 4. A difference between the circuit configurations of FIGS. 4 and 5 is that, in the latter, (1) the audio signal is not fed to the non-reversing input terminal 2a of the amplifier 2, but to the reversing input terminal 2b, and (2) a resistor R15 is shunted between the terminal 5 and ground. In FIG. 5, in order for the impedance to the left of the terminal 5 to equal to that of the right of the terminal 6, the following equation should be satisfied $$\frac{R'14 \cdot R'15}{R'14 + R'15} = \frac{R'11 \cdot R'12}{R'11 + R'12} \quad (4)$$

The equation (4) can be satisfied even if either the resistors R11 or R15 is omitted, so that either thereof can be deleted. Furthermore, in the case where the resistances of the resistors R14 and R12 are equal to each other, both resistors R11 and R15 can be omitted.

As a result, if Equation (4) is satisfied and if the impedance of one side of the circuits X5 and Y5 with respect to the center point of a potentiometer (not shown), the terminal 4, and ground is equal to the impedance of the other side, the frequency response of the tone controller of FIG. 5 is made flat if the potentiometer the slidable contact is positioned at the center. The gain at the flat frequency response becomes − (R'14/R'10).

Figure 6:
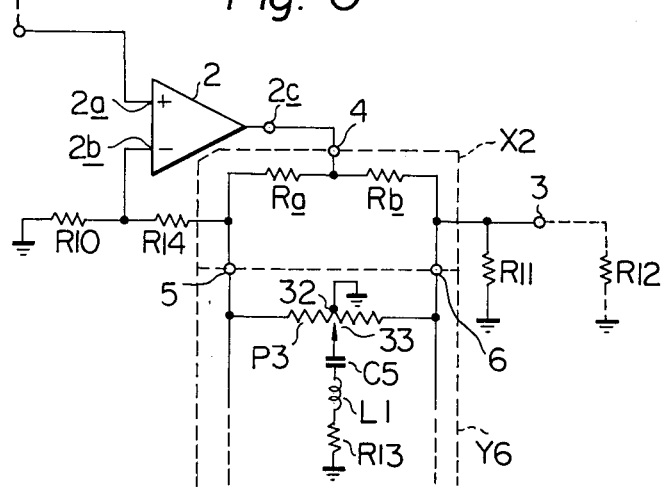
FIG. 6 is a detailed circuit configuration of the tone controller of FIG. 4.

In the following, there is described the noise suppression effect of the present invention in connection with FIGS. 2 and 6–9B. In FIG. 6, there is shown a detailed circuit configuration of FIG. 4. The difference between the circuits of FIGS. 2 and 6 is that, in the latter, the resistor R14 is added and a resistor Ra is provided as a substitution for the resistor Rc. In the following, it is assumed that (1) in FIG. 2, "$n-1$" additional impedance circuits, each of which resembles the impedance circuit Y2, are connected as to be in parallel with the circuit Y2 and (2) in FIG. 6, "$n-1$" additional impedance circuits, each resembling circuit Y6, are connected parallel with the circuit Y6, wherein "$n$" is a positive integer more than 2. Furthermore, it is assumed that, in FIGS. 2 and 6, (1) the slidable contact 33 of the potentiometer P3 of the illustrated impedance circuit is positioned at an end of the potentiometer connected to the terminal 5, (2) each of the remaining "$n-1$" impedance circuits has a potentiometer with a slidable contact positioned at the center thereof, (3) a noise voltage generated or induced in the series circuit consisting of C5, L1, and R13 is V$n$, and (4) the terminal 4 of the amplifier 2 is the output terminal of each of the tone controllers of FIGS. 2 and 6 as a substitution for the terminal 3. In the above, assumption (4) follows the fact that the portion between the terminals 4 and 3 in FIG. 2 is equal to that in FIG. 6.

Figure 7A:
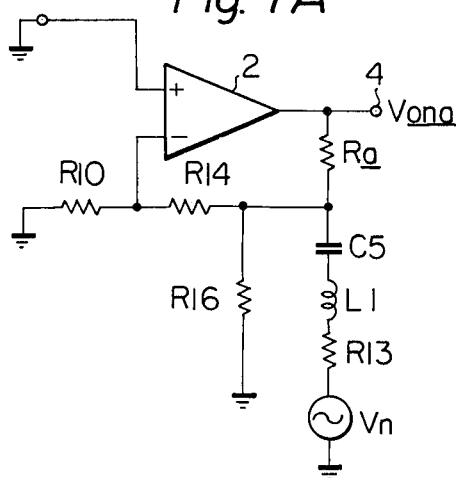
FIG. 7A is an equivalent circuit of FIG. 6 for illustration of the present invention.
Figure 7B:
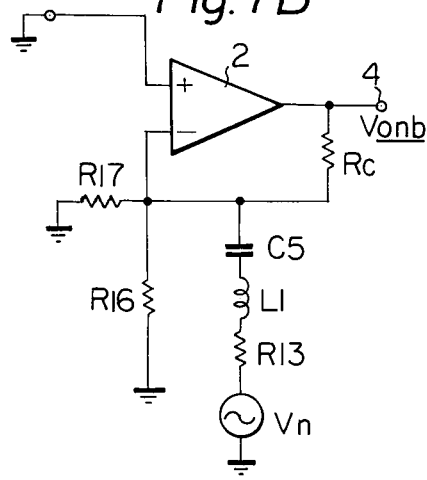
FIG. 7B is an equivalent circuit of FIG. 2 for illustration of the prior art.

As a consequence, equivalent circuits for the circuits of FIGS. 6 and 2 can be respectively drawn as shown in FIGS. 7A and 7B, wherein the resistance of the resistor R16 is the total parallel resistance of the "$n$" potentiometers provided in the impedance circuits of FIG. 6 or 2. If it is furthermore assumed that amplifier 2 has a remarkably large or infinite gain, the circuits of FIGS. 7A and 7B are redrafted to be those of FIGS. 8A and 8B, wherein an impedance of an impedance unit Z1 is $$Z'1 = \frac{1}{j\omega C'5} + j\omega L'1 + R'13 \quad (5)$$

Figure 8A:
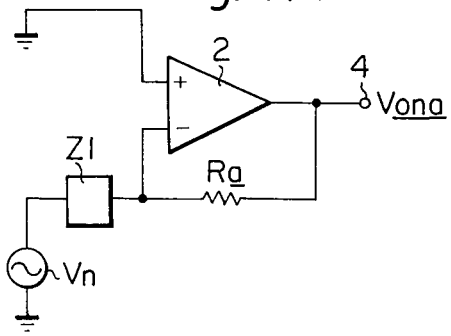
FIG. 8A is a circuit modified based on the circuit of FIG. 7A for illustration of the present invention.

Therefore, a noise voltage Vona of FIG. 8A is $$V_{ona} = -\frac{R'a}{Z'1} V_n \quad (6)$$

Figure 8B:
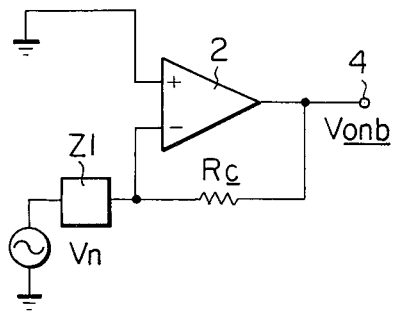
FIG. 8B is a circuit modified based on the circuit of FIG. 7B for illustration of the prior art.

On the other hand, a noise voltage Vonb of FIG. 8B is $$V_{onb} = -\frac{R'c}{Z'1} V_n \quad (7)$$

In the following, in order to determine which is larger, the noise voltages Vona or Vonb, a relationship between the resistances of the resistors Ra and Rc is described. For convenience of illustration, the following assumptions are made. First, it is assumed that the gain and frequency characteristic of the circuit of FIG. 6 are equal to those of FIG. 2, respectively. Second, since the portion between the terminals 3 and 4 of FIG. 6 is equal to that of FIG. 2, these portions are omitted so that the terminal 4 can be assumed to be the output terminal of each of the portion circuits of FIGS. 2 and 6. Last, the portion below the terminal 5 is denoted by reference character Z2. Therefore, the circuits of FIGS. 6 and 2 can be redrawn as respectively shown in FIGS. 9A and 9B. Now, assuming that (1) the impedance Z2 is not connected to each of the terminals 5 of FIGS. 9A and 9B, (2) the gain of the circuit of FIG. 9A is equal to that of FIG. 9B, and (3) the impedance measured at the terminal 5 in FIG. 9A is equal to that in FIG. 9B, then the gain of the circuit of FIG. 9A is equal to that of FIG. 9B even if the impedance Z2 is connected to each of the terminals 5 of FIGS. 9A and 9B.

Figure 9A:
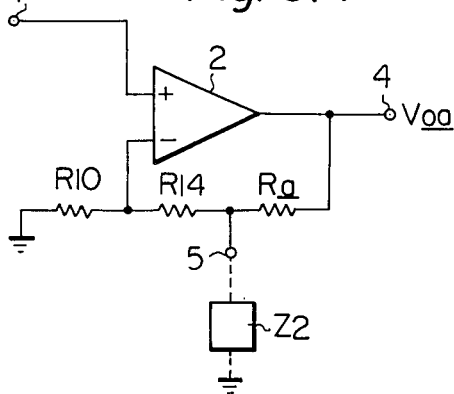
FIG. 9A is a circuit modified based on the circuit of FIG. 6 for illustration of the present invention.
Figure 9B:
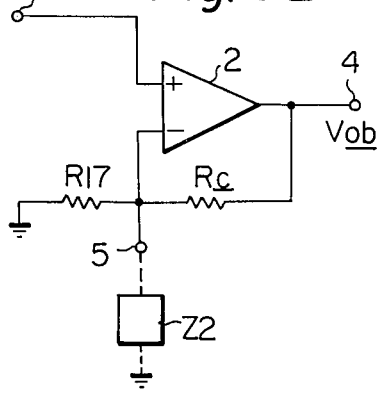
FIG. 9B is a circuit modified based on the circuit of FIG. 2 for illustration of the prior art.

In the above, if the impedances, which are measured at the terminals 5 of FIGS. 9A and 9B, are equal to each other, then the following equation is satisfied $$\frac{R'17 \cdot R'c}{R'17 + R'c} = \frac{(R'10 + R'14)R'a}{R'10 + R'14 + R'a} \quad (8)$$

Furthermore, if the gains of the circuits of FIGS. 9A and 9B, under the condition that the impedance Z2 is not connected to the terminal 5, are equal to each other, then the following equation is satisfied $$\frac{R'17 + R'c}{R'17} = \frac{R'10 + R'14 + R'a}{R'10} \quad (9)$$

$$\therefore R'c = \frac{(R'14 + R'a)R'17}{R'10}$$

substituting the equation (9) into (8) gives $$R'17 = \frac{(R'10 + R'14)R'a}{R'14 + R'a} \quad (10)$$

Then, substituting the equation (10) into (9) gives $$R'c = \frac{R'10 + R'14}{R'10} R_a \quad (11)$$

Still furthermore, in the case where the impedance Z2 is connected to each of the terminals 5 of FIGS. 9A and 9B, the gains of the circuits of FIGS. 9A and 9B, which are respectively denoted by reference characters Ga and Gb, are $$Ga = 1 + \frac{(R'10 + R'14)R_a + (R'14 + R'a)Z'2}{R'10 \cdot Z'2} \quad (12)$$

$$Gb = 1 + \frac{(R'17 + Z'2)R'c}{R'17 \cdot Z'2} \quad (13)$$

Substituting the equations (10) and (11) into (13) gives $$Gb = 1 + \frac{(R'10 + R'14)R'a + (R'14 + R'a)Z'2}{R'10 \cdot Z'2}$$

Therefore, we obtain $$Ga = Gb \quad (14)$$

In the following, the noise voltages Vona and Vonb are compared under the condition that the equations (10) and (11) are satisfied. Substituting Equation (11) into (7) gives $$V_{onb} = -\frac{R'10 + R'14}{R'10} \cdot \left(\frac{R'a}{Z'1}\right) \cdot V_n \quad (15)$$

Then, substituting Equation (15) into (6) gives $$V_{ona} = \frac{R'10}{R'10 + R'14} \cdot V_{onb} \quad (16)$$

In the above, since $R'10 > 0$, and $R'14 > 0$, one obtains $$\frac{R'10}{R'10 + R'14} < 1 \quad (17)$$

As a result, we obtain $$V_{ona} < V_{onb} \quad (18)$$

This means that the noise suppression of the circuit of FIG. 6 is larger than that of FIG. 2.

Figure 10:
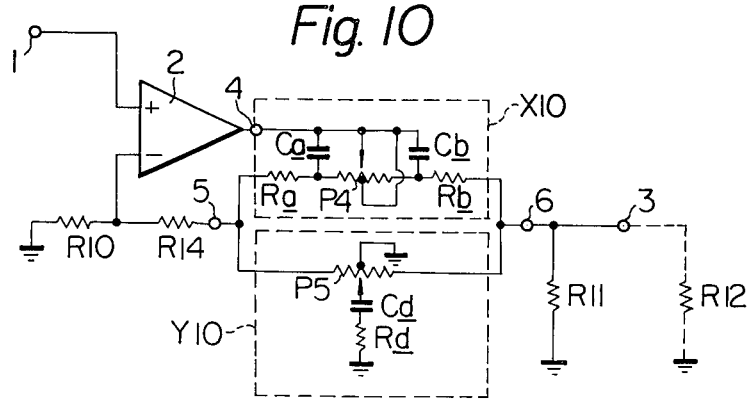
FIG. 10 is another detailed circuit configuration of the tone controller of FIG. 4.

Reference is now made to FIG. 10, which is a modification of the circuit of FIG. 6. The difference between the circuits of FIGS. 10 and 6 is that impedance circuits X10 and Y10 of FIG. 10 differ from the circuits X6 and Y6 of FIG. 6. As shown, opposite ends of potentiometer P4 are connected to the terminals 5 and 6 by the resistors Ra and Rb. Capacitors Ca and Cb are respectively connected between opposite ends of potentiometer P4 and terminal 4. Potentiometer P4 includes a center tap (no numeral) directly connected to the terminal 4 and a slidable contact (no numeral), also directly connected to the terminal 4. On the other hand, the circuit Y10 comprises another potentiometer P5 having opposite ends connected to terminals 5 and 6 and a grounded center tap. A series circuit consisting of a capacitor Cd and a resistor Rd is connected between a slidable contact (no numeral) of the potentiometer P5 and ground.

The frequency characteristic of the circuit of FIG. 10 can be made flat, when each of the slidable contacts of the potentiometers P4 and P5 is positioned at the center point thereof under the following conditions: (1) the resistances of the resistors R10, R11, R12, and R14 satisfy the following equation $$R'10 + R'14 = \frac{R'11 \cdot R'12}{R'11 + R'12}$$

and (2) the impedance of one side of the circuits X10 and Y10 with respect to the terminal 4 and ground is equal to that of the other side. The above conditions can be realized by equalizing the capacitances of the capacitors Ca and Cb, the resistances of the resistors Ra and Rb, and by making the resistances of each of the potentiometers P4 and P5 symmetrical with respect to the center tap thereof.

A pair of electrical components with same resistance or same capacitance are readily obtained, and a potentiometer having symmetrical resistances with respect to its center tap, is also obtainable with ease, so that it is understood that the flat frequency response can be easily obtained according to the circuit of FIG. 10.

Figure 13:
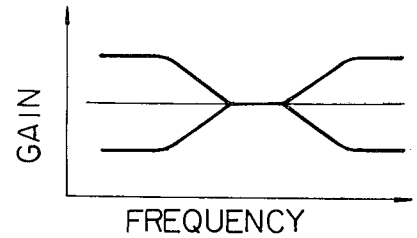
FIG. 13 is a graph showing a frequency response according to the present invention.

As shown in FIG. 10, each of potentiometers P4 and P5 is provided with a center tap. However, these taps can be omitted when the above described symmetry is achieved. The frequency characteristic of the circuit of FIG. 10 is shown in FIG. 13, wherein gains at the higher and the lower frequencies are independently changed by adjusting the sliders of potentiometers P4 and P5, respectively.

Figure 11:
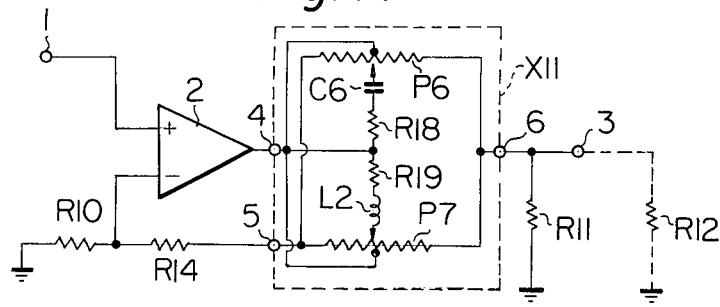
FIG. 11 is another detailed circuit configuration of the tone controller of FIG. 4.

Reference is now made to FIG. 11, wherein there is illustrated another modification of the circuit of FIG. 6. A difference between the circuits of FIGS. 6 and 11 is that the latter lacks a circuit corresponding to the impedance circuit Y6. As shown, two potentimeters P6 and P7 of an impedance circuit X11 are connected between the terminals 5 and 6. The potentiometer P6 has a center tap (no numeral) connected to the terminal 4 and a slidable contact (no numeral) which is connected to terminal 4 by a series circuit consisting of a capacitor C6 and a resistor R18. Potentiometer P7 has a center tap (no numeral) connected to the terminal 4 and a slidable contact (no numeral) connected to terminal 4 by a series circuit consisting of a resistor R19 and an indicator L2. A flat frequency response with the circuit of FIG. 11 can be readily obtained in the same manner as discussed in connection with the previously described embodying the present invention, so that further description thereof will be omitted for brevity. The frequency characteristic of the circuit of FIG. 11 is illustrated in FIG. 13.

Figure 12:
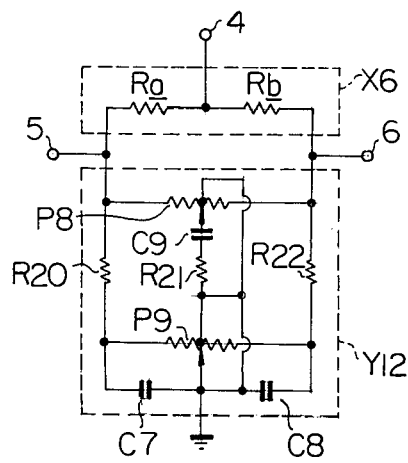
FIG. 12 is still another detailed circuit configuration of the tone controller of FIG. 4.

In FIG. 12, another example of preferred impedance circuits for use in the present invention is illustrated. A potentiometer P8 of an impedance circuit Y12 is connected between the terminals 5 and 6, and another potentiometer P9 is connected, through resistors R20 and R22, between the terminals 5 and 6. A series circuit consisting of two capacitors C7 and C8 are connected in parallel with the potentiometer P9. Center taps (no numeral) of the potentiometers P8 and P9 are connected to ground. A series circuit consisting of a resistor R21 and a capacitor C9 is connected between a slidable contact (no numeral) of the potentiometer P8 and ground, and a junction between the capacitors C7 and C8 is grounded.

Figure 14:
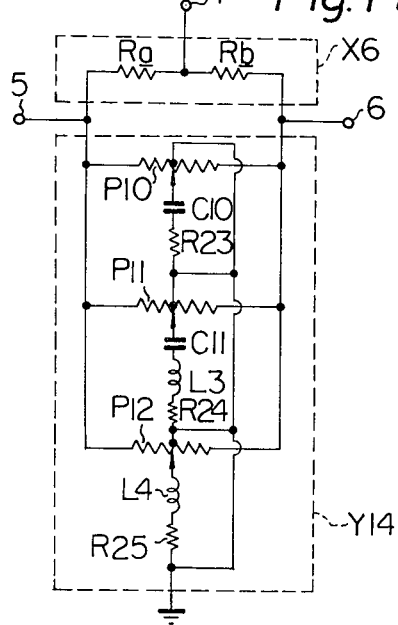
FIG. 14 is another detailed circuit configuration of the tone controller of FIG. 4.

In FIG. 14, still another example of a preferred impedance circuit for use in the present invention is illustrated. As shown, three potentiometers P10, P11, and P12 are connected in parallel between the terminals 5 and 6, and center tapes of these three potentiometers are grounded. A series circuit consisting of a capacitor C10 and a resistor R23 is connected between a slidable contact of the potentiometer P10 and ground, another series circuit consisting of a capacitor C11, an inductor L3, and a resistor R24 is connected between a slidable contact of the potentiometer P11 and ground, and still another series circuit consisting of an inductor L4 and a resistor R25 is connected between a slidable contact of the potentiometer P12 and ground. Flat frequency responses of the circuits of FIGS. 12 and 14 can be easily obtained as indicated in the aforementioned embodiments of the present invention, so that further description thereof is omitted for clarification.

Figure 15:
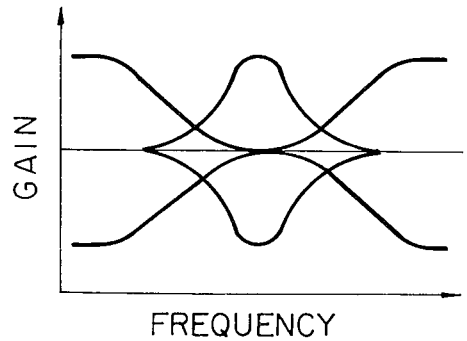
FIG. 15 is a graph showing a freqeuncy response according to the present invention.

A frequency characteristic of the circuit of FIG. 12 is illustrated in FIG. 13. wherein gains at the higher and lower frequency range are independently changed; frequency characteristics of the circuit of FIG. 14, wherein gains at the higher and lower frequency range can be independently varied, being illustrated in FIG. 15.

In the circuit of FIG. 6, if the resistances of the resistors R10, R11, R12, R14, Ra, and Rb are selected to satisfy the following equation $$\frac{(R'10 + R'14)R'a}{R'10 + R'14 + R'a} = \frac{R'11 \cdot R'12 \cdot R'b}{R'11 \cdot R'12 + R'11 \cdot R'b + R'12 \cdot R'b} \tag{19}$$

a flat frequency response can be obtained even though the resistance of the resistor Ra is not equal to that of the resistor Rb, on condition that the slidable contact 32 is positioned at the center point of potentiometer Pe and the circuit Y6 is symmetrically arranged. The above results from the fact that the impedance circuit X6 consists of only resistances. Therefore, the above applies to the circuits of FIGS. 12 and 14.

Figure 16:
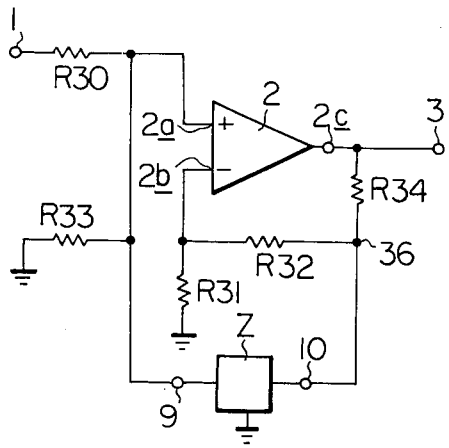
FIG. 16 is another tone controller embodying the present invention, partly in block diagram.

Reference is now made to FIG. 16, which shows a second preferred tone controller embodying the present invention. The non-reversing input terminal 2a of the amplifier 2 is connected to the input terminal through a resistor R30 to be responsive to an audio, electrical signal. The resistor R30 is an input resistance involving an output resistance of the preceding stage (not shown). The non-reversing input terminal 2a is shunted to ground by a resistor R33 and is responsive to a feedback signal, as derived from terminal 9 of impedance circuit Z. On the other hand, the reversing input terminal 2b of the amplifier 2 is connected to ground through a resistor R31 and to the impedance circuit Z through both a feedback resistor R32 and a terminal 10. As shown, a resistor R34 is interposed between the output terminal 2c and a junction 36. The terminal 2C is directly connected to the output terminal 3. An electrical audio signal from the input terminal 1 is divided by the resistors R30, R33, and the impedance circuit Z, and then fed to the amplifier through the non-reversing input terminal 2a. The amplified signal appearing at the terminal 2c is divided by the resistor R34 and the impedance circuit Z, then further divided by the resistors R32 and R31 to be negatively fed back to the reversing input terminal 2b. Therefore, tone control with the circuit of FIG. 16 is attained out by adjusting the impedance of the impedance circuit Z. It is understood that, just as in the preceding embodiments, the noise generated in the impedance circuit Z can be reduced to a remarkable extent by virtue of feedback resistor R32 being employed in the circuit of FIG. 16.

Figure 17:
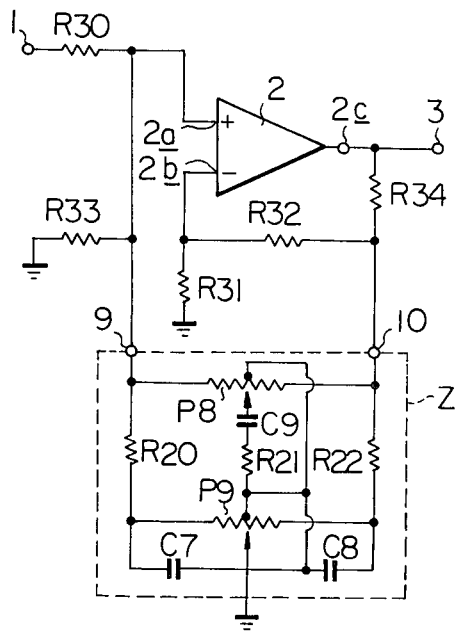
FIG. 17 is a detailed circuit configuration of the tone controller of FIG. 16.

Reference is now made to FIG. 17, wherein there are illustrated details of the impedance circuit Z of FIG. 16. As seen from the drawing of FIG. 17, the impedance circuit Z is identical with the circuit Y12 of FIG. 12, so that further description thereof is omitted for brevity. In FIG. 17, if the resistances of the resistor R30, R31, R32, R33, and R34 are selected in such a manner as to satisfy the following Equations (20) or (21), then impedance to the right of the terminal 10 is equal to that of the left of the terminal 9, so that a flat frequency response is provided with the circuit of FIG. 17 the impedance circuit Z is symmetrical with respect to ground.

$$\left.\begin{array}{l} R'31 + R'32 = R'33 \\ R'30 = R'34 \end{array}\right\} \quad (20)$$

$$\frac{R'30 \cdot R'33}{R'30 + R'33} = \frac{(R'31 + R'32)R'34}{R'31 + R'32 + R'34} \quad (21)$$

The frequency response of the circuit of FIG. 17 is illustrated in FIG. 13.

In FIG. 17, if the resistances of the resistors R30, R31, R32, R33, and R34 are selected in such a manner as to satisfy the following equation $$\left.\begin{array}{l} R'31 + R'32 = R'33 \\ R'30 = R'34 \end{array}\right\} \quad (22)$$

then, the gain of the circuit of FIG. 17 is $$1 + \frac{R'32}{R'31} \quad (23)$$

Therefore, the gain is changeable by varying the ratio of the resistances R32 and R31. In the circuit of FIG. 17, the resistor R33 can be removed without adversely affecting the characteristic of the circuit in question.

In the foregoing, it should be noticed that the gain and input impedance of amplifier 2 are both assumed to be infinite and the output impedance thereof to be zero.

It is understood from the foregoing that the tone controller of the present invention has the following important features: (1) the circuit configuration is very simple, (2) the frequency response can be readily flattened, (3) the flat frequency response gain can be controlled with ease, and (4) electrical noise generated in the reactance of the impedance network can be effectively reduced.

As many changes could be made in the above circuits and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A tone controller for use in an audio equipment, which comprises:
   an input terminal;
   an output terminal;
   an amplifier having reversing and nonreversing input terminals, one of said amplifier input terminals being connected to the tone controller input terminal to receive an audio signal through said input terminal to generate an amplified signal at an output terminal thereof;
   an impedance circuit unit provided with first, second, and third terminals, said first terminal of the impedance circuit being connected to the output terminal of said amplifier to receive the amplified signal, said second terminal of the impedance circuit being connected to supply a signal to said output terminal of the tone controller, the amplified signal received being controlled in its frequency characteristic in said impedance circuit unit to appear at said second terminal; and
   a feedback resistor connected between the reversing input terminal of said amplifier and said third terminal, in order to negatively feedback a fraction of the voltage of the amplified signal to said amplifier, said feed back resistor suppressing noise having a tendency to be coupled by said impedance circuit to said second terminal.

2. A tone controller as claimed in claim 1, wherein said impedance circuit unit comprises:
   a first and second potentiometer, one terminal of each of said potentiometers being connected to said second terminal, the other terminal of each potentiometer being connected to said third terminal, a center tap of each potentiometer being connected to said first terminal, a slidable contact of said first potentiometer being connected to said first terminal through a phase advance circuit including a series connected resistor and capacitor, a slidable contact of said second potentiometer being connected to said first terminal through a phase lag circuit including a series connected resistor and inductor.

3. A tone controller as claimed in claim 1, wherein said impedance circuit unit comprises at least two impedance circuits, one of said at least two impedance circuits including: a resistor means having a tap, one end of said resistor means being connected to said third terminal, the other end of said resistor means being connected to said second terminal, and the tap of said resistor means being connected to said first terminal, and
   the other one of said at least two impedance circuits including: a potentiometer having opposite terminals respectively connected to said third and second terminals, a center tap of said potentiometer being grounded, and a slidable contact of said potentiometer being connected to ground through a series circuit including in seriatum a resistor, an inductor, and a capacitor.

4. A tone controller as claimed in claim 1, wherein said impedance circuit unit comprises at least two impedance circuits, one of said at least two impedance circuits including: a potentiometer having a center tap connected to said first terminal, a capacitor connected between said first terminal and one end of said potentiometer, another capacitor connected between said first terminal and an other end of said potentiometer, a slidable contact of said potentiometer being connected to said first terminal, a resistor connected between said third terminal and said one end of said potentiometer, and another resistor connected between said other end of said potentiometer and said second terminal, and
   the other one of said at least two impedance circuits including: another potentiometer having a grounded center tap, opposite ends of said another potentiometer being respectively connected to said third and second terminals, said another potentiometer having a slidable contact connected to ground through a phase lag circuit including a resistor and capacitor in seriatum.

5. A tone controller as claimed in claim 1, wherein said impedance circuit unit comprises at least two impedance circuits, one of said at least two impedance circuits including: resistor means having opposite ends respectively connected to said third and second terminals, and a tap connected to said first terminal,
   the other one of said at least two impedance circuits including: a first potentiometer having opposite ends respectively connected to said third and second terminals, and a grounded center tap, said first potentiometer including a slidable contact connected to ground through a phase lag circuit including a resistor and capacitor in seriatum, a second potentiometer having opposite ends respectively connected to said third and second terminals through first and second resistors, said second potentiometer including a grounded center tap and a grounded slidable contact, capacitor means connected in parallel with said second potentiometer and having a grounded tap.

6. A tone controller as claimed in claim 1, wherein said impedance circuit unit comprises at least two impedance circuits, one of said at least two impedance circuits including: a resistor means connected in series between said second and third terminals, and including a tap connected to said first terminal, the other one of said at least two impedance circuits including: three potentiometers, first and second ends of each of said potentiometers being respectively connected to said third and second terminals, a center tap of each of said potentiometers being grounded, a slidable contact of a first one of said three potentiometers being connected to ground through a phase lag circuit including a resistor and capacitor in seriatum, a slidable contact of a second one of said three potentiometers being connected to ground through a circuit including a resistor, inductor and capacitor in seriatum, a slidable contact of a third one of said three potentiometers being connected to ground through a phase advance circuit including a resistor and inductor in seriatum.

7. A tone controller for use in an audio equipment which comprises:
an input terminal;
an output terminal;
a first resistor connected to said input terminal;
an amplifier provided with a reversing and a nonreversing input terminal, and an output terminal coupled to said output terminal of said tone controller, said nonreversing input terminal of said amplifier being connected to said input terminal, through said first resistor to be responsive to an audio signal and said amplifier generating an amplified signal at its output terminal;
a second resistor having one end connected to said output terminal of said amplifier;
at least one impedance circuit provided with first and second terminals, said impedance circuit being connected via said first terminal to said nonreversing input terminal and via said second terminal to the other end of said second resistor; and
a feedback resistor connected between said other end of said second resistor and said reversing input terminal.

8. A tone controller as claimed in claim 7, wherein at least one inpedance circuit comprises: a first potentiometer having opposite ends respectively connected to said nonreversing input terminal, and to the output terminal of said tone controller and a grounded center tap, a second potentiometer having opposite ends respectively connected to said nonreversing input terminal via a resistor and to the output terminal of said tone controller via another resistor, said second potentiometer including a center tap connected to a slidable contact of said first potentiometer through a circuit including a resistor and capacitor series connected between the slidable contact and the center tap of the second potentiometer, the center tap of the second potentiometer also being connected to a center tap of said first potentiometer, a slidable contact of said second potentiometer being grounded, and capacitor means connected in parallel with said second potentiometer and having a tap connected to the center taps of said first and second potentiometers.

9. A tone controller for use in audio equipment comprising:
an input terminal adapted to be responsive to an audio frequency input signal,
an output terminal for deriving a tone controlled replica of the input signal,
a high gain amplifier having reversing and nonreversing input terminals and an output terminal for deriving an amplified signal, one of said amplifier input terminals being connected to said controller input terminal to be responsive to the audio frequency input signal, said amplifier output terminal being coupled to said controller output terminal so that the amplified audio frequency signal is supplied from the amplifier output terminal to the controller output terminal,
a frequency response control circuit having a first terminal connected to the amplifier output terminal and a second terminal, and means for connecting said second terminal to one of the amplifier input terminals so that said one amplifier input terminal is responsive to a replica of the audio signal at the second terminal, said control circuit including a reactance having a tendency to cause noise to be derived by the tone controller,
a negative feedback path between the amplifier output terminal and the reversing input terminal, said negative feedback path including a resistor having one terminal connected to one terminal of the tone control circuit, another terminal of the resistor being connected to supply a feedback voltage to said reversing terminal, said resistor suppressing the noise which tends to be derived by the control circuit.

10. The tone controller of claim 9 wherein the control circuit includes a potentiometer having opposite ends connected in series between the controller output terminal and the second terminal of the control circuit, said potentiometer including a slider connected in circuit with a reactance of the control circuit so that variation of the slider position changes the amplitude versus frequency response of the tone controller.

11. The tone controller of claim 10 wherein the second terminal of the control circuit is connected to said nonreversing terminal and the one terminal of the resistor is connected to the first terminal of the control circuit.

12. The tone controller of claim 10 wherein the resistor is connected to said second terminal of the control circuit, and is included in the means for connecting the second terminal of the control circuit to said one amplifier input terminal.

13. The tone controller of claim 12 wherein the control circuit includes a third terminal connected to be responsive to the amplified signal at said controller output terminal, said first terminal of the control circuit being connected to the controller output terminal, whereby current derived from the control circuit flows to the first terminal and thence is divided to flow to the second and third terminals.

14. The tone controller of claim 9 wherein the second terminal of the control circuit is connected to said non-reversing terminal and the one terminal of the resistor is connected to the first terminal of the control circuit.

15. The tone controller of claim 9 wherein the resistor is connected to said second terminal of the control circuit, and is included in the means for connecting the second terminal of the control circuit to said one amplifier input terminal.

* * * * *